（12）United States Patent
Yun et al.

(10) Patent No.: US 11,249,119 B2
(45) Date of Patent: Feb. 15, 2022

(54) INDUCTION HEATING APPARATUS AND CONTROLLING METHOD THEREOF

(71) Applicant: Samsung Electronics Co., Ltd, Suwon-si (KR)

(72) Inventors: Chang Sun Yun, Suwon-si (KR); Hong Joo Kang, Suwon-si (KR); Chang Seob Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 419 days.

(21) Appl. No.: 15/745,113

(22) PCT Filed: Jul. 27, 2016

(86) PCT No.: PCT/KR2016/008219
§ 371 (c)(1),
(2) Date: Jan. 15, 2018

(87) PCT Pub. No.: WO2017/023008
PCT Pub. Date: Feb. 9, 2017

(65) Prior Publication Data
US 2019/0018048 A1    Jan. 17, 2019

(30) Foreign Application Priority Data

Aug. 4, 2015 (KR) .................. 10-2015-0109905

(51) Int. Cl.
*G01R 19/165*    (2006.01)
*H05B 6/06*    (2006.01)
(Continued)

(52) U.S. Cl.
CPC ............ *G01R 19/165* (2013.01); *H05B 1/02* (2013.01); *H05B 6/062* (2013.01); *H05B 6/12* (2013.01); *H05B 6/44* (2013.01); *H05B 2213/05* (2013.01)

(58) Field of Classification Search
CPC .......... G01R 9/165; H05B 1/02; H05B 6/062; H05B 6/12; H05B 6/44; H05B 2213/05; H05B 6/065
See application file for complete search history.

(56) References Cited

U.S. PATENT DOCUMENTS 3,989,916 A * 11/1976 Amagami ............. H02M 7/523
219/622
6,316,754 B1    11/2001 Schatz et al.
(Continued)

FOREIGN PATENT DOCUMENTS

CN    102783247 A    11/2012
CN    204442727 U *  7/2015  ............. H05B 6/065
(Continued)

OTHER PUBLICATIONS

The First Office Action in connection with Chinese Application No. 201680043915.8 dated Apr. 22, 2020, 20 pages.
(Continued)

*Primary Examiner* — Erin Deery

(57) ABSTRACT

An induction heating apparatus includes a coil driver configured to have a plurality of selectable resonant frequencies, and a controller configured to control the coil driver. The coil driver drives a coil according to a control signal from the controller.

8 Claims, 13 Drawing Sheets

(51) Int. Cl.
*H05B 1/02* (2006.01)
*H05B 6/12* (2006.01)
*H05B 6/44* (2006.01)

(56) References Cited

U.S. PATENT DOCUMENTS

| | | | |
|---|---|---|---|
| 6,362,463 | B1 | 3/2002 | Bessyo et al. |
| 7,022,952 | B2 | 4/2006 | de Rooij et al. |
| 9,867,235 | B2 | 1/2018 | Aranda Vazquez et al. |
| 2009/0139986 | A1* | 6/2009 | Lee .................... H05B 1/0266 219/622 |
| 2011/0000904 | A1 | 1/2011 | Sakakibara et al. |
| 2014/0008356 | A1 | 1/2014 | Uchida et al. |
| 2018/0098387 | A1 | 4/2018 | Aranda Vazquez et al. |

FOREIGN PATENT DOCUMENTS

| | | |
|---|---|---|
| EP | 0926926 A1 | 6/1999 |
| EP | 2068598 A1 | 6/2009 |
| EP | 2744300 A1 | 6/2014 |
| ES | 2362523 A1 | 7/2011 |
| KR | 10-2001-0079608 A | 8/2001 |
| KR | 10-0574414 B1 | 4/2006 |
| KR | 10-2009-0057495 A | 6/2009 |
| WO | 2011/107325 A1 | 9/2011 |

OTHER PUBLICATIONS

Communication pursuant to Article 94(3) EPC dated Feb. 4, 2020 in connection with European Patent Application No. 16 833 244.3, 4 pages.
International Search Report dated Oct. 31, 2016 in connection with International Patent Application No. PCT/KR2016/008219.
Written Opinion of the International Searching Authority dated Oct. 31, 2016 in connection with International Patent Application No. PCT/KR2016/008219.
Supplementary European Search Report dated Jun. 22, 2018 in connection with European Patent Application No. 16 83 3244.
Office Action dated Nov. 24, 2020 in connection with Chinese Patent Application No. 201680043915.8, 14 pages.
Communication pursuant to Article 94(3) EPC dated Jun. 29, 2021, in connection with European Patent Application No. 16 833 244.3, 5 pages.
Notice of Preliminary Rejection dated May 20, 2021 in connection with Korean Patent Application No. 10-2015-0109905, 13 pages.
Korean Intellectual Property Office, "Notice of Patent Allowance" dated Nov. 29, 2021, in connection with Korean Patent Application No. 10-2015-0109905, 3 pages.

* cited by examiner

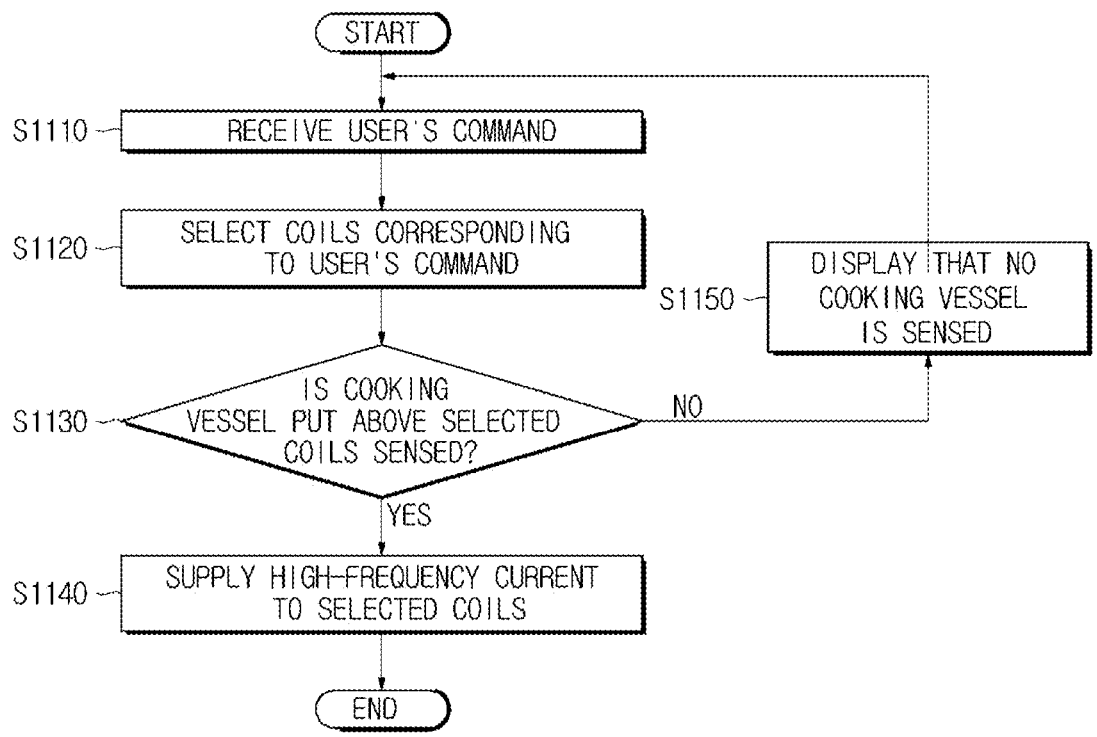

INDUCTION HEATING APPARATUS AND CONTROLLING METHOD THEREOF

CROSS-REFERENCE TO RELATED APPLICATIONS AND CLAIM OF PRIORITY

The present application claims priority under 35 U.S.C. § 365 and is a 371 National Stage of International Application No. PCT/KR2016/008219 filed Jul. 27, 2016, which claims priority to Korean Patent Application No. 10-2015-0109905 filed Aug. 4, 2015, the disclosures of which are fully incorporated herein by reference into the present disclosure as if fully set forth herein.

TECHNICAL FIELD

The present disclosure relates to an induction heating apparatus including coils, and a control method thereof.

BACKGROUND

Generally, an induction heating apparatus is a cooking appliance for heating food using the principle of induction heating. The induction heating apparatus includes a cooking table on which a cooking vessel is put, and a coil to generate a magnetic field when current is applied thereto.

If current is applied to the coil to generate a magnetic field, secondary current is induced to the cooking vessel, and Joule heat is generated due to the resistance components of the cooking vessel.

Accordingly, the cooking vessel is heated by such high-frequency current so that food contained in the cooking vessel is cooked.

When a cooking vessel is put on the induction heating apparatus, the cooking vessel itself acts as a heating source. Accordingly, a cooking vessel made of steel, stainless steel, nickel, or the like, which are metallic, needs to be used. That is, cooking vessels made of aluminum, ceramics, glass, or the like are not appropriate for the induction heating apparatus, since the materials have low electric resistance so as not to be easily heated.

SUMMARY

Embodiments of the present disclosure are directed to providing an induction heating apparatus including a circuit configuration having a plurality of resonant frequencies, and a method of controlling the induction heating apparatus.

One aspect of the present disclosure provides an induction heating apparatus. The induction heating apparatus includes a coil driver configured to have a plurality of selectable resonant frequencies, and a controller configured to control the coil driver, wherein the coil driver drives a coil according to a control signal from the controller.

The coil driver may have two or more resonant frequencies.

The coil driver may include a plurality of coils connected in series, a plurality of other coils connected in series, a switching device disposed between the plurality of coils, a switching device disposed between the plurality of other coils, a plurality of capacitors connected to the plurality of coils, and a plurality of other capacitors connected to the plurality of other coils.

The controller may turn on or off the switching device disposed between the plurality of coils, and turn on or off the switching device disposed between the plurality of other coils.

The plurality of coils may be provided with two coils, and the plurality of other coils are provided with other two coils.

The plurality of capacitors connected to the plurality of coils may be two or more capacitors, and the plurality of other capacitors connected to the plurality of other coils may be two or more capacitors.

The coil driver may further include a current sensor disposed between an input terminal of the coil driver and a node of the plurality of coils connected in series and the plurality of other coils connected in series.

The coil driver further include a current sensor connected between an output terminal of the plurality of coils connected in series and a node of the plurality of capacitors, and another current sensor connected between an output terminal of the plurality of other coils connected in series and a node of the plurality of other capacitors.

The controller may compare a current value detected by at least one current sensor to a reference current value to determine whether a cooking vessel is put above a coil corresponding to the at least one current sensor.

The coil driver may further include a switching device connected between an output terminal of the plurality of coils connected in series and a node of the plurality of capacitors, and another switching device connected between an output terminal of the plurality of other coils connected in series and a node of the plurality of other capacitors, wherein the output terminal of the plurality of coils connected in series may be electrically connected to the output terminal of the plurality of other coils connected in series.

The controller may turn on or off the switching device disposed between the plurality of coils, turn on or off the switching device disposed between the plurality of other coils, turn on or off the switching device connected between the output terminal of the plurality of coils connected in series and the node of the plurality of capacitors, and turn on or off the other switching device connected between the output terminal of the plurality of other coils connected in series and the node of the plurality of other capacitors.

In the coil driver, the plurality of capacitors connected to the plurality of coils may be two pairs of capacitors, wherein a switching device may be disposed between the two pairs of capacitors, and the plurality of other capacitors connected to the plurality of other coils may be two pairs of other capacitors, wherein the switching device may be disposed between the two pairs of other capacitors.

The controller may turn on or off the switching device disposed between the plurality of coils, turn on or off the switching device disposed between the plurality of other coils, and turn on or off the switching device disposed between the two pairs of capacitors.

The coil driver may include a first surge suppressor connected in parallel to a switching element which is disposed between the plurality of coils and a second surge suppressor connected in parallel to a switching element which is disposed between the plurality of other coils.

Each of the first surge suppressor and the second surge suppressor may include a resistor and a capacitor connected in series.

The coil driver may include a first coil and a second coil, a first switching device connecting an input terminal of the coil driver to one end of the first coil or one end of the second coil, according to a control signal from the controller, and a second switching device connecting the other end of the first coil to an output terminal of the coil driver or the one end of the second coil, according to a control signal from the controller.

The coil driver may further include a first surge suppressor disposed between an input terminal of the coil driver and the one end of the first coil, a second surge suppressor disposed between the other end of the first coil and an output terminal of the coil driver, a third surge suppressor disposed between the input terminal of the coil driver and the one end of the second coil, and a forth surge suppressor disposed between the other end of the first coil and the one end of the second coil.

The coil driver may be provided in plural.

The plurality of coil driver may be connected in parallel to each other.

The plurality of coils may be connected in series forms one burner and the plurality of other coils forms another burner.

Another aspect of the present disclosure provides a method of controlling an induction heating apparatus. The method includes at a controller, generating a control signal, and at a coil driver having a plurality of selectable resonant frequencies, driving a coil according to the control signal.

The induction heating apparatus according to the embodiments of the present disclosure allows a user to select various resonant frequencies, thereby providing a user convenience.

Also, the induction heating apparatus according to the embodiments of the present disclosure and the control method thereof can change a range of high-frequency current flowing to a coil according to a selected resonant frequency of a circuit so as to allow a user to adjust a heating value of the coil using various methods.

BRIEF DESCRIPTION OF DRAWINGS

FIG. 13 is a control flow chart of the induction heating apparatus according to an embodiment.

DETAILED DESCRIPTION

Hereinafter, embodiments of the present disclosure will be described in detail with reference to the appended drawings such that one of ordinary skill in the art can easily understand and embody the present disclosure. In the following description, well-known functions or constitutions will not be described in detail if they would unnecessarily obscure the embodiments of the present disclosure.

Hereinafter, embodiments of an induction heating apparatus and a control method thereof will be described with reference to the accompanying drawings.

Hereinafter, an embodiment of a configuration of the induction heating apparatus will be described with reference to FIGS. 1 to 5.

Figure 1:
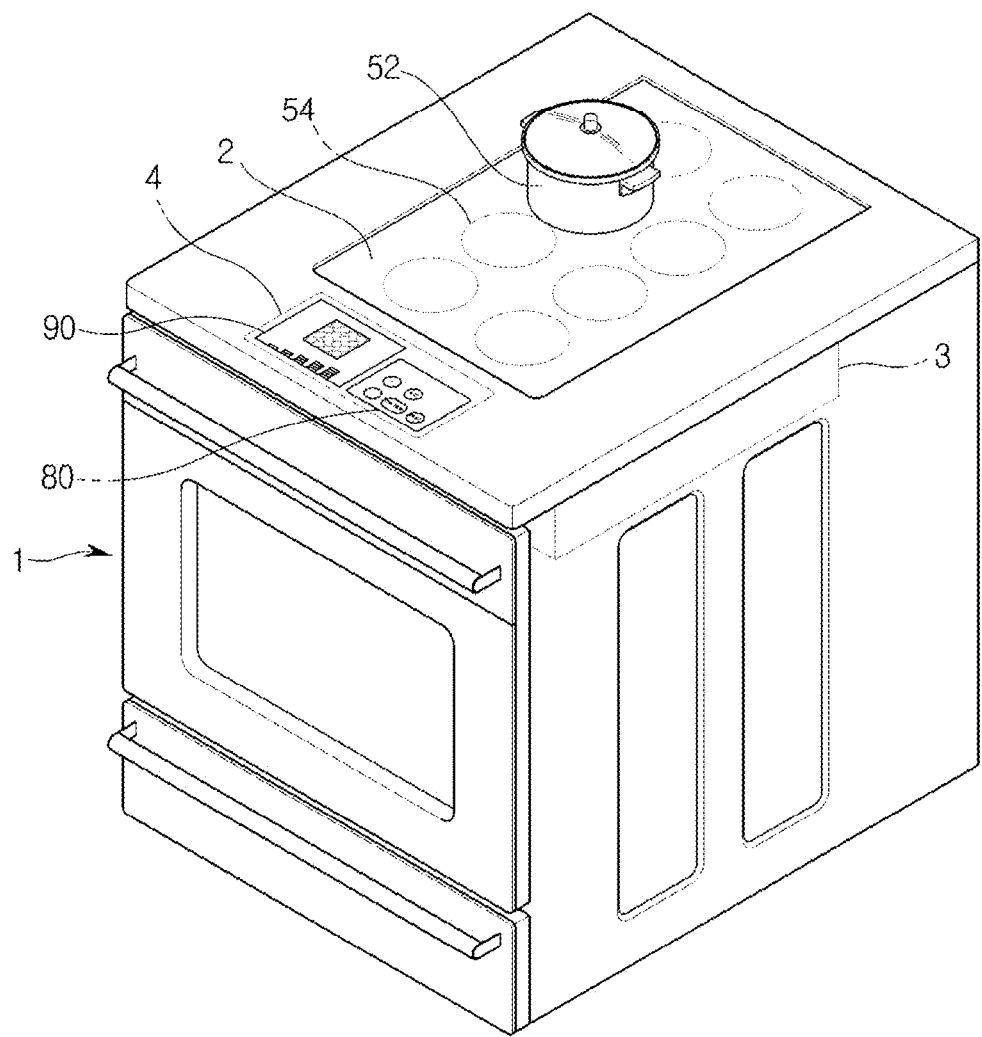
FIG. 1 shows an induction heating apparatus according to an embodiment.

FIG. 1 shows an induction heating apparatus according to an embodiment. As shown in FIG. 1, the induction heating apparatus according to an embodiment may include a main body 1. On the top of the main body 1, a cooking table 2 on which a cooking vessel 52 can be put may be mounted. The cooking table 2 may be made of ceramics. In the inside of the main body 1, a plurality of coils 54 may be disposed below the cooking table 2 to provide the cooking table 2 with heating sources. The coils 54 may be equally spaced throughout the entire area of the cooking table 2.

In the current embodiment, a case in which 8 coils are arranged in the form of a 4×2 matrix will be described as an example. Also, unlike the embodiment shown in FIG. 1, the coils 54 may be arranged non-uniformly throughout the entire area of the cooking table 2.

Also, unlike the embodiment shown in FIG. 1, the induction heating apparatus may include induction heating coils of 7 or less, or 9 or more. That is, the number of the coils 54 is not limited to 8.

Also, a controller 3 may be disposed below the cooking table 2 to drive the coils 54.

On the top of the main body 1, a control panel 4 including an input device 80 configured with a plurality of manipulation buttons to enable a user to input a command for driving the coils 54 to the controller 3, and a display 90 to display information related to operations of the induction heating apparatus may be disposed.

Figure 2:
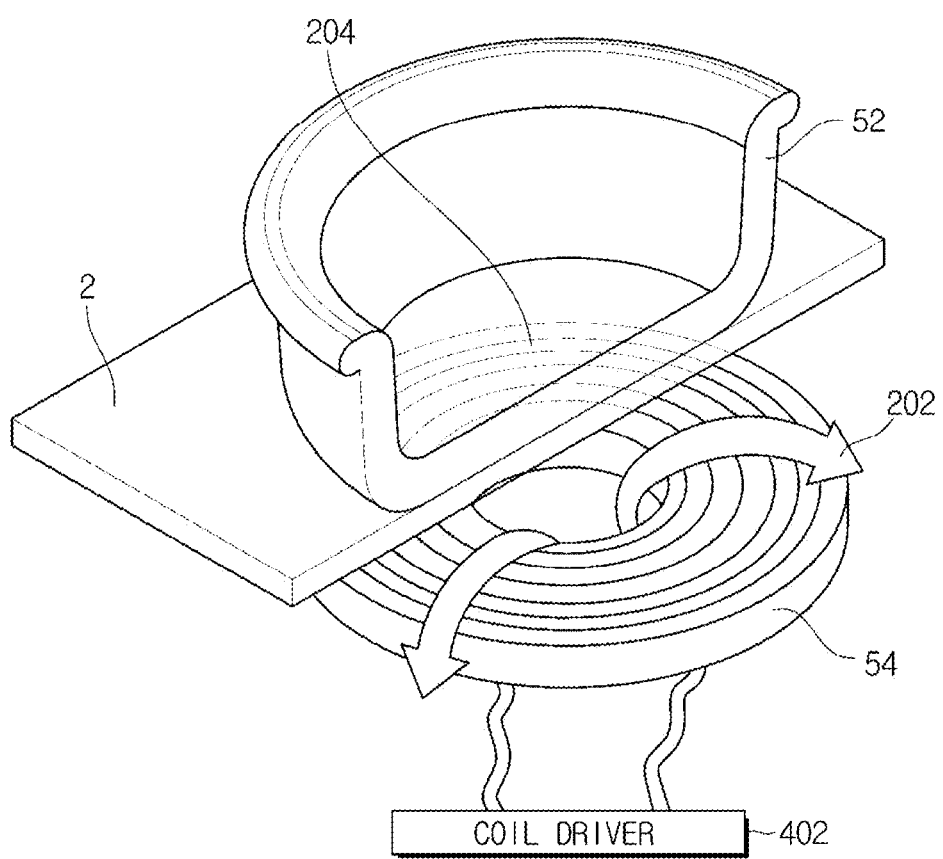
FIG. 2 shows a structure of a coil of the induction heating apparatus shown in FIG. 1.

FIG. 2 shows a structure of a coil of the induction heating apparatus shown in FIG. 1. As shown in FIG. 2, each coil 54 may be installed in a spiral shape below the cooking table 2, and the coil 54 may be electrically connected to a coil driver 402. The coil driver 402 may apply high-frequency current to the coil 54.

The cooking vessel 52 may be put on the top of the cooking table 2. If high-frequency current is supplied to the coil 54 when the induction heating apparatus operates, magnetic force lines may be formed in the coil 54 in directions indicated by arrows 202, and due to the magnetic force lines, induced current denoted by a reference numeral 204 may be generated in the form of eddy currents on the bottom of the cooking vessel 52 put on the top of the cooking table 2.

Figure 3:
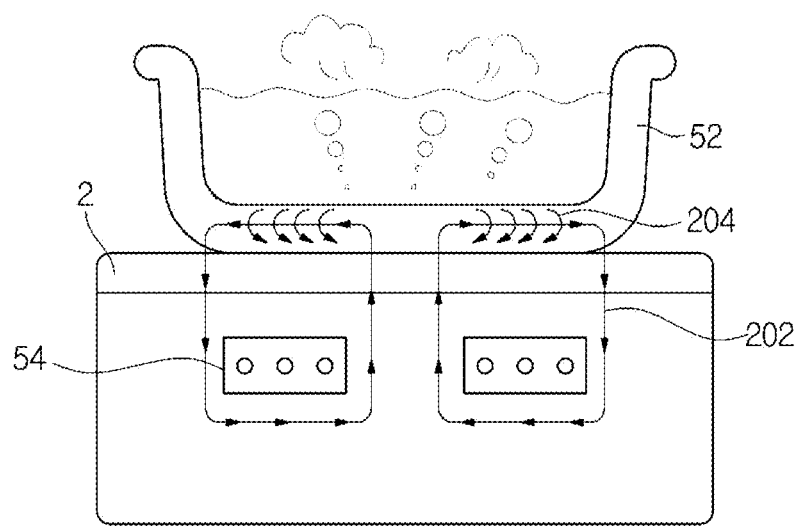
FIG. 3 is a view for describing the principle of heating of the induction heating apparatus shown in FIG. 1.

FIG. 3 is a view for describing the principle of heating of the induction heating apparatus shown in FIG. 1. The induction heating apparatus may heat food contained in the cooking vessel 52 using electric resistance and eddy currents generated by the Law of Magnetic Induction.

It has been described in advance with reference to FIG. 2 that if high-frequency current flows to the coil 54, magnetic force lines are formed around the coil 54, and the magnetic force lines generate induced current in the form of eddy currents on the bottom of the cooking vessel 52. The frequency of the high-frequency current may be from 20 kHz to 35 kHz. If the cooking vessel 52 made of a metal material is put within a range to which the magnetic force lines formed around the coil 54 influence, the magnetic force lines around the coil 54 may pass through the bottom of the cooking vessel 52 to generate induced current in the form of eddy currents according to the Law of Magnetic Induction. Due to interactions between the induced current in the form of eddy currents and the electric resistance of the cooking vessel 52, heat may be generated from the cooking vessel 52 to heat food contained in the cooking vessel 52. Since a cooking vessel put on the induction heating apparatus itself acts as a heating source, a cooking vessel made of steel, stainless steel, nickel, etc., which is metallic, may need to be used. That is, cooking vessels made of aluminum, ceramics, glass, or the like are not appropriate for the induction heating apparatus, since the materials have low electric resistance so as not to be easily heated.

Figure 4:
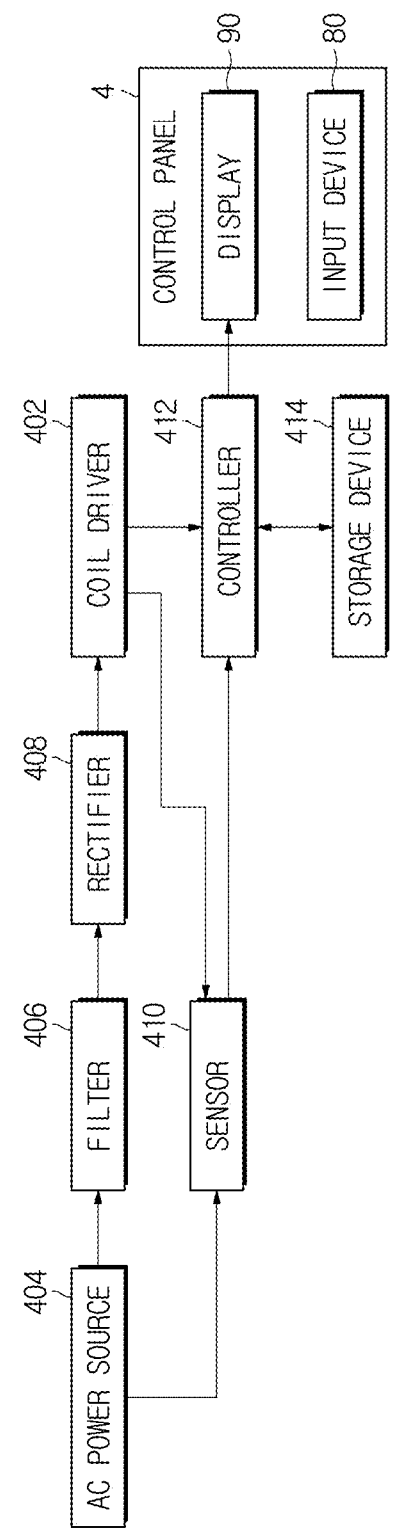
FIG. 4 is a control block diagram of the induction heating apparatus shown in FIG. 1.

FIG. 4 is a control block diagram of the induction heating apparatus shown in FIG. 1. In FIG. 4, a coil driver 402 may include the coil 54 shown in FIGS. 2 and 3.

An Alternating-Current (AC) power source 404 may be a power source to supply commercial AC power of, for example, 325V 50 Hz. AC power supplied from the AC power source 404 may be transferred to a filter 406 so that noise is removed by the filter 406. Then, the resultant AC power may be transferred to a rectifier 408.

The rectifier 408 may convert the AC power to Direct-Current (DC) power, and then transfer the DC power to the coil driver 402. The DC power transferred to the coil driver 402 may be converted to high-frequency power by switching in the coil driver 402, and then applied to the coil 54.

The coil driver 402 may convert the DC power to the high-frequency power, supply the high-frequency power to the coil 54, and distribute current which will flow to the coil 54 to adjust power that the heated coil 54 will consume. Details about the coil driver 402 will be described later.

A sensor 410 may sense an operation of the induction heating apparatus, and transfer the result of the sensing to the controller 412. More specifically, the sensor 410 may include a current sensor 502 (see FIG. 5) to sense input current supplied from the AC power source 404 to the rectifier 408 and current flowing to the coil 54. Details about the current sensor 502 will be described later.

The controller 412 may control operations of the induction heating apparatus.

Also, the controller 412 may control operations of components included in the induction heating apparatus, based on current of the coils 54 sensed by the sensor 410, a user's command input to the input device 80, and predetermined power data stored in a storage device 414.

For example, the controller 412 may transfer a control signal corresponding to an output level input to the input device 80 to the coil driver 402 to adjust a magnitude and frequency of high-frequency current that is generated by the coil driver 402.

Also, the controller 412 may selectively block power supply to the coil driver 402 so as for the coil driver 402 to supply power only to a user's desired one(s) of the coils 54 and to block power supply to the remaining one(s) of the coils 54.

The controller 412 may be involved in power supply to the coil driver 402 to generate switch driving signals P1 and P2 (also, referred to as first switch driving signals) for a plurality of switching devices Q1 and Q2 (see FIG. 5) in the coil driver 402 to perform switching, and provide the first switching driving signals P1 and P2 to the coil driver 402. The switching devices Q1 and Q2 of the coil driver 402 may be switched by the first switching driving signals P1 and P2.

Also, the controller 412 may generate other switch driving signals (also, referred to as second switch driving signals) for other switching devices Sw1 and Sw2 (see FIG. 5) for selecting a resonant frequency in the coil driver 402 to perform switching, and provide the second switch driving signals to the coil driver 402. The switching devices Sw1 and Sw2 of the coil driver 402 may be switched by the second switch driving signals.

Also, the controller 412 may determine whether the cooking vessel 52 is put above the coil 54, based on current flowing to the coil 54 sensed by the sensor 410. For example, if the sensor 410 senses current flowing to any one coil 54 as current that is lower than a reference value, the controller 412 may determine that the cooking vessel 52 is put above the corresponding coil 54.

The controller 412 may function as a Central Processing Unit (CPU), and the CPU may be a microprocessor. Herein, the microprocessor may be a processor in which an Arithmetic and Logic Unit (ALU), a register, a program counter, a command decoder, a control circuit, etc. are mounted on at least one silicon chip. Also, the microprocessor may include a Graphic Processing Unit (GPU) for graphic processing of images or video. The microprocessor may be implemented in the form of System On Chip (SoC) including a core and a GPU. The microprocessor may include a single core, a dual core, a triple core, a quad core, and a multiple core.

Also, the controller 412 may include a graphic processing board including a GPU, RAM, or ROM, which is mounted on a separate circuit substrate electrically connected to the microprocessor.

Also, the controller 412 may include an input/output processor to mediate data input/output between various components included in the induction heating apparatus and the controller 412, and memory to store programs and data.

The storage device 414 may store data and programs needed for the control of the induction heating apparatus.

The storage device 414 may include non-volatile memory, such as Read Only Memory (ROM), Random Access Memory (RAM), a magnetic disk storage device, and a flash memory device, or another non-volatile semiconductor memory device.

For example, the storage device 414 may use, as a semiconductor memory device, a Secure Digital (SD) memory card, a Secure Digital High Capacity (SDHC) memory card, a mini SD memory card, a mini SDHC memory care, a Trans Flash (TF) memory card, a micro SD memory card, a micro SDHC memory card, a memory stick, Compact Flash (CF), a Multi-Media Card (MMC), MIVIC micro, or an eXtreme Digital (XD) card.

Also, the storage device 414 may include a network-attached storage device that is accessed through a network.

Figure 5:
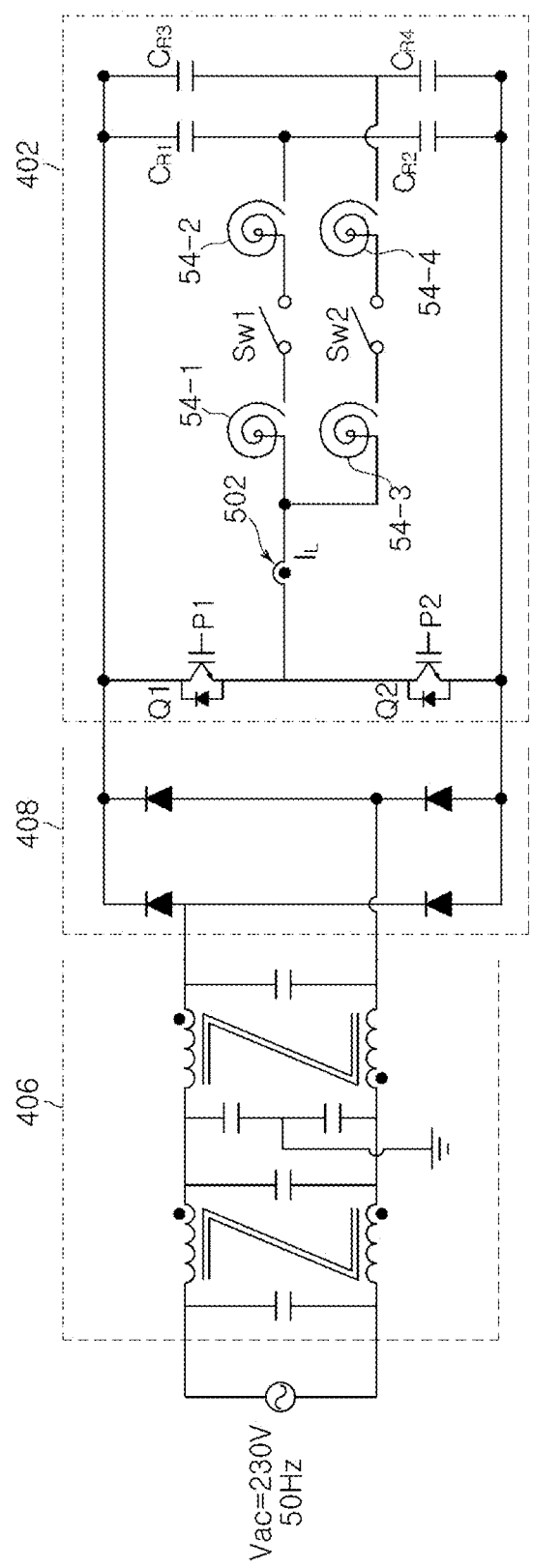
FIG. 5 shows a circuit configuration of an induction heating apparatus according to a first embodiment.

FIG. 5 shows a circuit configuration of an induction heating apparatus according to a first embodiment.

Referring to FIG. 4, the filter 406 may be configured with a transformer and a capacitor to remove noise included in power supplied from the AC power source 404.

The rectifier 408 may constitute a bridge rectifier circuit with a plurality of diodes. AC power passed through the filter 406 may be converted to DC power by rectification of the plurality of diodes of the rectifier 408.

The coil driver 402 may be based on a half-bridge circuit configured with the plurality of switching devices Q1 and Q2 and a plurality of capacitors CR1 and CR2 or CR3 and CR4.

The switching devices Q1 and Q2 may be turned on/off by the first switch driving signals P1 and P2 generated by a switch driver 412. The switching devices Q1 and Q2 may be Insulated Gate Bipolar Transistors (IGBTs).

The coil driver 402 may equally divide an input voltage Vi through the capacitors CR1 and CR2 or CR3 and CR4 having the same capacitance so that a voltage of Vi/2 may be applied at both terminals of each of the capacitors CR1 and CR2 or CR3 and CR4.

The switching devices Q1 and Q2 may include a feedback diode to cause current to continuously flow to an inductive load. In the coil driver 402, the plurality of switching devices Q1 and Q2 may be alternately turned on/off to supply AC current of a predetermined frequency to the coils 54.

The current sensor 502 may be disposed on a current path between a node of the switching devices Q1 and Q2 and a plurality of coils 54-1 to 54-4. The current sensor 502 may detect a magnitude of coil current IL flowing to two coils 54-1 and 54-2 or 54-3 and 54-4 selected according to operation of the switching devices Sw1 and Sw2. Information (for example, information about the magnitude of the coil current IL) of the coil current IL detected by the current sensor 502 may be provided to the controller 412.

In this case, the controller 412 may turn on any one switching device Sw1 or Sw2 among the plurality of switching devices Sw1 and Sw1, and operate the current sensor 502. If the controller 412 determines that current flowing to the coils 54-1 and 54-2 or 54-3 and 54-4 is lower than a reference value, the controller 412 may determine that the cooking vessel 52 is put above the corresponding coils 54-1 and 54-2 or 54-3 and 54-4.

Also, information (for example, information of an input voltage Vi applied at both terminals of the two capacitor CR1 and CR2 connected in series) of a voltage applied to the selected two coils 54-1 and 54-2 or 54-3 or 54-4 may be provided to the controller 412.

In the coil driver 402, the frequency of high-frequency current applied to the coils 54 may be fixed, or may have a specific value according to a control signal from the controller 412. The frequency of the high-frequency current may decide the intensity of a magnetic field around the coils 54, and induced current may be formed in the cooking vessel 52 in proportion to the intensity of the magnetic field. As a result, a heating value of the cooking vessel 52 may be decided in proportion to the frequency of high-frequency current applied to the coils 54.

Meanwhile, if the frequency of the high-frequency current is identical to a resonant frequency of the circuit, resonance may occur so that the magnitude of the induced current becomes maximum, resulting in an improvement in efficiency of the circuit. If various resonant frequencies can be selected, it is possible to improve the efficiency of the circuit using various frequencies of high-frequency current.

The coil driver 402 may have a circuit configuration to allow a user to select one of various resonant frequencies. In order to provide the circuit configuration, in the coil driver 402 according to the first embodiment, any one switching device (that is, a first switching device Sw1) may be disposed between the two coils 54-1 and 54-2 connected in serial, another switching device (that is, a second switching device Sw2) may be disposed between the remaining two coils 54-3 and 54-4 connected in series, and the coils 54-1 and 54-2 may be connected in parallel to the coils 54-3 and 54-4. A series circuit including the first switching device Sw1 may be connected to a node between the two capacitors CR1 and CR2, and a series circuit including the second switching device Sw2 may be connected to a node between the other two capacitors CR3 and CR4.

If the first switching device Sw1 is turned on, and the second switching device Sw2 is turned off, a resonant frequency ($f1=1/[2\pi \times \sqrt{(L1 \times C1)}]$) may be formed by inductance L1 of the two coils 54-1 and 54-2 connected in series and capacitance C1 of the two capacitors CR1 and CR2.

If the first switching Sw1 is turned off, and the second switching device Sw2 is turned on, a resonant frequency ($f2=1/[2\pi \times \sqrt{(L2 \times C2)}]$) may be formed by inductance L2 of the two coils 54-3 and 54-4 connected in series and capacitance C2 of the two capacitors CR3 and CR4.

If the first switching Sw1 is turned on, and the second switching device Sw2 is turned on, a resonant frequency ($f3=1/[2\pi \times \sqrt{(L3 \times C3)}]$) may be formed by total inductance L3 of the two coils 54-1 and 54-2 connected in series and the other two coils 54-3 and 54-4 connected in series and total capacitance C3 of the two capacitors CR1 and CR2 and the other two capacitors CR3 and CR4.

Accordingly, the coil driver 402 according to the first embodiment may have three resonant frequencies f1, f2, and f3 according to operations of the first and second switching devices Sw1 and Sw2.

The first switching device Sw1 and the second switching device Sw2 may be tuned on or off according to a switch driving signal from the controller 412.

Meanwhile, in FIG. 5, the current sensor 502 is disposed on the current path between the node of the switching devices Q1 and Q2 and the plurality of coils 54-1 to 54-4. However, the location of the current sensor 502 is not limited to this. Also, in FIG. 5, the first and second coils 54-1 and 54-2 of the coil driver 402 are connected to the two capacitors CR1 and CR2, and the third and fourth coils 54-3 and 54-4 of the coil driver 402 are connected to the other two capacitors CR3 and CR4. However, the capacitors CR3 and CR4 may be omitted, and in this case, the third and fourth coils 54-3 and 54-4 may also be connected to the capacitors CR1 and CR2 through the second switch device Sw2.

Figure 6:
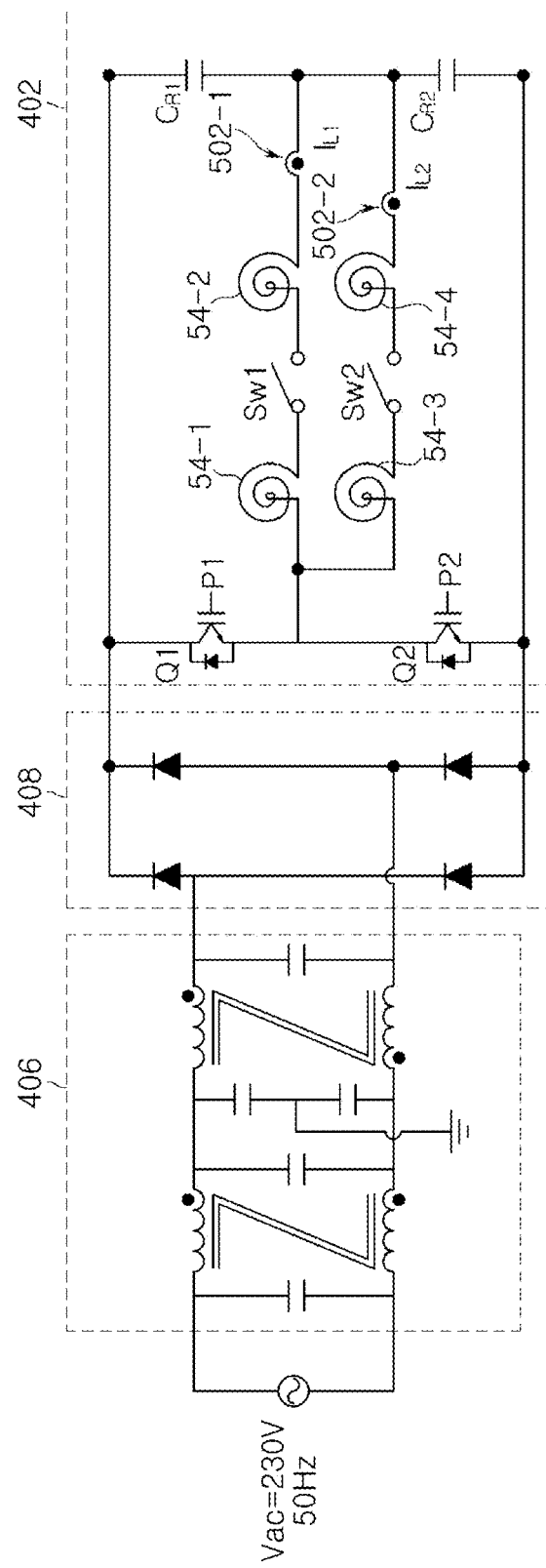
FIG. 6 shows a circuit configuration of an induction heating apparatus according to a second embodiment.

FIG. 6 shows a circuit configuration of an induction heating apparatus according to another embodiment (a second embodiment).

According to the second embodiment, a first current sensor 502-1 among a plurality of current sensors may detect a magnitude of coil current IL1 flowing to the first and second coils 54-1 and 54-2 when the first switching device Sw1 is turned on, and a second current sensor 502-2 among the plurality of current sensors may detect a magnitude of coil current IL2 flowing to the third and fourth coils 54-3 and 54-4 when the second switching device Sw2 is turned on. Information (that is, information about the magnitudes of the coil current IL1 and IL2) of the coil current IL1 and IL2 detected by the first and second current sensors 502-1 and 502-2 may be provided to the controller 412.

In this case, the controller 412 may turn on the first switching device Sw1, and operate the first current sensor 502-1. If the controller 412 determines that current flowing to the coils 54-1 and 54-2 is lower than the reference value, the controller 412 may determine that the cooking vessel 52 is put above the corresponding coils 54-1 and 54-2. Also, the controller 412 may turn on the second switching device Sw2, and operate the second current sensor 502-2. If the controller 412 determines that current flowing to the coils 54-3 and 54-4 is lower than the reference value, the controller 412 may determine that the cooking vessel 52 is put above the corresponding coils 54-3 and 54-4.

In the coil driver 402 according to the second embodiment, any one switching device (that is, the first switching device Sw1) may be disposed between the two coils 54-1 and 54-2 connected in series, another switching device (that is, the second switching device Sw2) may be disposed between the two coils 54-3 and 54-4 connected in series, and the coils 54-1 and 54-2 may be connected in parallel to the coils 54-3 and 54-4.

According to the second embodiment, a series circuit including the first switching device Sw1 may be connected to the node between the two capacitors CR1 and CR2, and a series circuit including the second switching device Sw2 may also be connected to the node between the two capacitors CR1 and CR2.

If the first switching Sw1 is turned on, and the second switching device Sw2 is turned off, a resonant frequency (f1'=1/[2π×√(L1×C1)]) may be formed by the inductance L1 of the two coils 54-1 and 54-2 connected in series and the capacitance C1 of the two capacitors CR1 and CR2.

If the first switching Sw1 is turned off, and the second switching device Sw2 is turned on, a resonant frequency (f2'=1/[2π×√(L2×C1)]) may be formed by the inductance L2 of the two coils 54-3 and 54-4 connected in series and the capacitance C1 of the two capacitors CR1 and CR2.

If the first switching device Sw1 is turned on, and the second switching device Sw2 is turned on, a resonant frequency (f3'=1/[2π×√(L3×C1)]) may be formed by the total inductance L3 of the two coils 54-1 and 54-2 connected in series and the other two coils 54-3 and 54-4 connected in series and the capacitance C1 of the two capacitors CR1 and CR2.

Accordingly, the coil driver 402 according to the second embodiment may have three resonant frequencies f1' f2', and f3' according to operations of the first and second switching devices Sw1 and Sw2.

The first switching device Sw1 and the second switching device Sw2 may be turned on or off according to a switch driving signal from the controller 412.

Meanwhile, the coil driver 402 may have another circuit configuration to allow a user to select one of various resonant frequencies. A circuit configuration of the coil driver 402 according to a third embodiment will be described with reference to FIG. 7, below.

Figure 7:
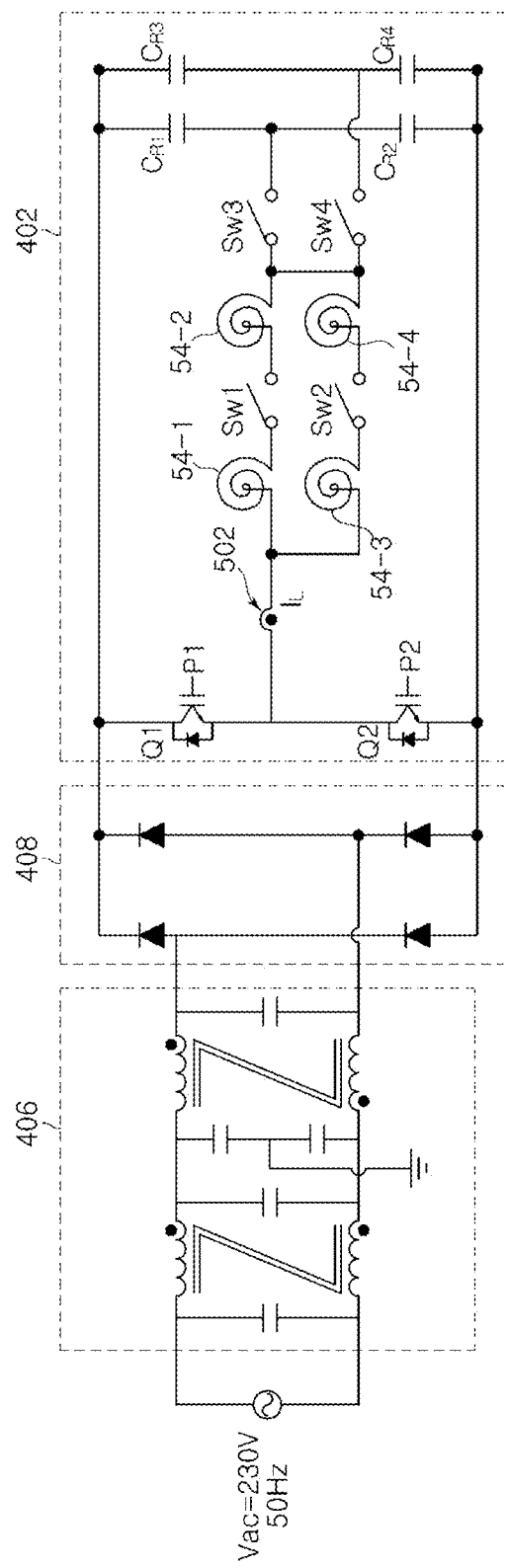
FIG. 7 shows a circuit configuration of an induction heating apparatus according to a third embodiment.

FIG. 7 shows a circuit configuration of an induction heating apparatus according to a third embodiment.

Referring to FIG. 7, in the coil driver 402 according to the third embodiment, any one switching device (that is, the first switching device Sw1) may be disposed between the two coils 54-1 and 54-2 connected in series, another switching device (that is, the second switching device Sw2) may be disposed between the other two coils 54-3 and 54-4 connected in series, and the coils 54-1 and 54-2 may be connected in parallel to the coils 54-3 and 54-4. A series circuit including the first switching device Sw1 may be connected to the node between the two capacitors CR1 and CR2, and a series circuit including the second switching device Sw2 may be connected to the node between the other two capacitors CR3 and CR4.

According to the third embodiment, if the two coils 54-1 and 54-2 connected to the first switching device Sw1 are respectively referred to as a first coil 54-1 and a second coil 54-2, the second coil 54-2 may be connected to another switching device (that is, a third switching device Sw3), and if the two coils 54-3 and 54-4 connected to the second switching device Sw2 are respectively referred to as a third coil 54-3 and a fourth coil 54-4, the fourth coil 54-4 may be connected to another switching device (that is, a fourth switching device Sw4). In this case, a node between the second coil 54-2 and the third switching device Sw3 may be connected to a node between the fourth coil 54-4 and the fourth switching device Sw4.

If the first switching Sw1 is turned on, the second switching device Sw2 is turned off, the third switching device Sw3 is turned on, and the fourth switching device Sw4 is turned off, a resonant frequency (f4=1/[2π×√(L1×C1)]) may be formed by the inductance L1 of the two coils 54-1 and 54-2 connected in series and the capacitance C1 of the two capacitors CR1 and CR2.

If the first switching device Sw1 is turned on, the second switching device Sw2 is turned off, the third switching device Sw3 is turned off, and the fourth switching device Sw4 is turned on, a resonant frequency (f5=1/[2π×√(L1×C2)]) may be formed by the inductance L1 of the first and second coils 54-1 and 54-2 connected in series and the capacitance C2 of the other two capacitors CR3 and CR4.

If the first switching device Sw1 is turned off, the second switching device Sw2 is turned on, the third switching device Sw3 is turned on, and the fourth switching device Sw4 is turned off, a resonant frequency (f6=1/[2π×√(L2×C1)]) may be formed by the inductance L2 of the third and fourth coils 54-3 and 54-4 connected in series and the capacitance C1 of the two capacitors CR1 and CR2.

If the first switching device Sw1 is turned off, the second switching device Sw2 is turned on, the third switching device Sw3 is turned off, and the fourth switching device Sw4 is turned on, a resonant frequency (f7=1/[2π×√(L2×C2)]) may be formed by the inductance L2 of the third and fourth coils 54-3 and 54-4 connected in series and the capacitance C2 of the other two capacitors CR3 and CR4.

If the first switching device Sw1 is turned on, the second switching device Sw2 is turned on, the third switching device Sw3 is turned on, and the fourth switching device Sw4 is turned off, a resonant frequency (f0=1/[2π×√(L3×C1)]) may be formed by the total inductance L3 of the first and second coils 54-1 and 54-2 connected in series and the third and fourth coils 54-3 and 54-4 connected in series and the capacitance C1 of the two capacitors CR1 and CR2.

If the first switching device Sw1 is turned on, the second switching device Sw2 is turned on, the third switching device Sw3 is turned off, and the fourth switching device Sw4 is turned on, a resonant frequency (f9=1/[2π×√(L3×C2)]) may be formed by the total inductance L3 of the first and second coils 54-1 and 54-2 connected in series and the third and fourth coils 54-3 and 54-4 connected in series and the capacitance C2 of the other two capacitors CR3 and CR4.

If the first switching device Sw1 is turned on, the second switching device Sw2 is turned off, the third switching device Sw3 is turned on, and the fourth switching device Sw4 is turned on, a resonant frequency (f10=1/[2π×√(L1×C3)]) may be formed by the inductance L1 of the first and second coils 54-1 and 54-2 connected in series and the total capacitance C3 of the two capacitors CR1 and CR2 and the other two capacitors CR3 and CR4.

If the first switching Sw1 is turned off, the second switching device Sw2 is turned on, the third switching device Sw3 is turned on, and the fourth switching device Sw4 is turned on, a resonant frequency (f11=1/[2π×√(L2×C3)]) may be formed by the inductance L2 of the third and fourth coils 54-3 and 54-4 connected in series and the total capacitance C3 of the two capacitors CR1 and CR2 and the other two capacitors CR3 and CR4.

If the first switching Sw1 is turned on, the second switching device Sw2 is turned on, the third switching device Sw3 is turned on, and the fourth switching device Sw4 is turned on, a resonant frequency (f12=1/[2π×√(L3×C3)]) may be formed by the total inductance L3 of the first and second coils 54-1 and 54-2 connected in series and the third and fourth coils 54-3 and 54-4 connected in series and the total capacitance C3 of the two capacitors CR1 and CR2 and the other two capacitors CR3 and CR4.

Accordingly, the coil driver 402 according to the third embodiment may have nine resonant frequencies f4 to f12 according to operations of the first to fourth switching devices Sw1 to Sw4.

Herein, each of the first switching device Sw1 to the fourth switching device Sw4 may be turned on or off according to a switch driving signal of the controller 412.

The coil driver 402 may have another circuit configuration to allow a user to select one of various resonant frequencies. A circuit configuration of the coil driver 402 according to a fourth embodiment will be described with reference to FIG. 8, below.

Figure 8:
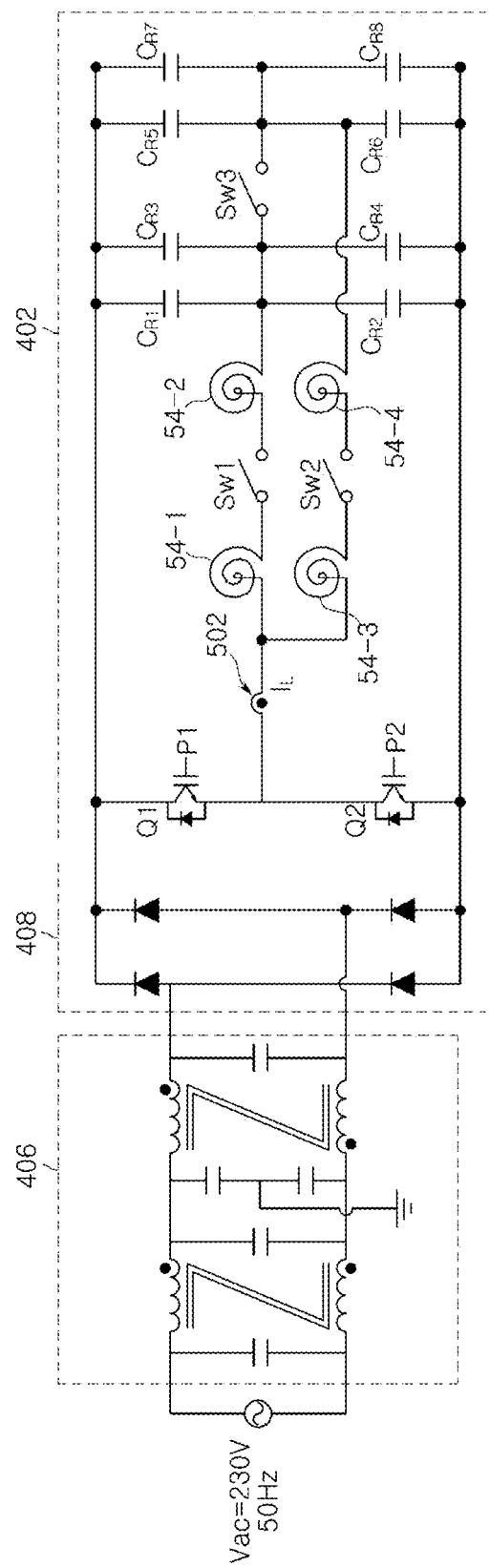
FIG. 8 shows a circuit configuration of an induction heating apparatus according to a fourth embodiment.

FIG. 8 shows a circuit configuration of an induction heating apparatus according to a fourth embodiment.

Referring to FIG. 8, in the coil driver 402 according to the fourth embodiment, any one switching device (that is, the first switching device Sw1) may be disposed between the two coils 54-1 and 54-2 connected in series, another switching device (that is, the second switching device Sw2) may be disposed between the two coils 54-3 and 54-4 connected in series, and the coils 54-1 and 54-2 may be connected in parallel to the coils 54-3 and 54-4.

A series circuit including the first switching device Sw1 may be connected to a node between four capacitors CR1 to CR4, and a series circuit including the second switching device Sw2 may be connected to a node between other four capacitors CR5 and CR8.

Also, according to the fourth embodiment, a separate switching device (also, referred to as a third switching device Sw3) may be further disposed between the node of the four capacitors CR1 to CR4 and the node of the other four capacitors CR5 to CR8.

Herein, if the first switching device Sw1 is turned on, the second switching device Sw2 is turned off, and the third switching device Sw3 is turned off, a resonant frequency ($f13=1/[2\pi\times\sqrt{(L1\times C4)}]$) may be formed by inductance L1 of the two coils 54-1 and 54-2 connected in series and capacitance C4 of the four capacitors CR1 to CR4.

If the first switching device Sw1 is turned off, the second switching device Sw2 is turned on, and the third switching device Sw3 is turned off, a resonant frequency ($f14=1/[2\pi\times\sqrt{(L2\times C5)}]$) may be formed by inductance L2 of the other two coils 54-3 and 54-4 connected in series and capacitance C5 of the other four capacitors CR5 to CR8.

If the first switching device Sw1 is turned on, the second switching device Sw2 is turned on, and the third switching device Sw3 is turned off, a resonant frequency f15 may be formed due to a resonance circuit formed by a connection between the two coils 54-1 and 54-2 connected in series and a node of the four capacitors CR1 to CR4 and a resonance circuit formed by a connection between the other two coils 54-3 and 54-4 connected in series and a node of the other four capacitors CR5 to CR8.

If the first switching device Sw1 is turned on, the second switching device Sw2 is turned off, and the third switching device Sw3 is turned on, a resonant frequency ($f16=1/[2\pi\times\sqrt{(L1\times C6)}]$) may be formed by the inductance L1 of the two coils 54-1 and 54-2 connected in series and total capacitance C6 of the four capacitors CR1 to CR4 and the other four capacitors CR5 to CR8.

If the first switching device Sw1 is turned off, the second switching device Sw2 is turned on, and the third switching device Sw3 is turned on, a resonant frequency ($f17=1/[2\pi\times\sqrt{(L2\times C6)}]$) may be formed by the inductance L2 of the other two coils 54-3 and 54-4 connected in series and the total capacitance C6 of the four capacitors CR1 to CR4 and the other four capacitors CR5 to CR8.

If the first switching device Sw1 is turned on, the second switching device Sw2 is turned on, and the third switching device Sw3 is turned on, a resonant frequency ($f18=1/[2\pi\times\sqrt{(L3\times C6)}]$) may be formed by the total inductance L3 of the two coils 54-1 and 54-2 connected in series and the other coils 54-3 and 54-4 connected in series and the total capacitance C6 of the four capacitors CR1 to CR4 and the other four capacitors CR5 to CR8.

Accordingly, the coil driver 402 according to the fourth embodiment may have six resonant frequencies f13 to f18 according to operations of the first to third switching devices Sw1 to Sw3.

Herein, each of the first switching device Sw1 to the third switching device Sw3 may be turned on or off according to a switch driving signal of the controller 412.

Meanwhile, the coil driver 402 may have another circuit configuration for improving the power efficiency of the circuit. A circuit configuration of the coil driver 402 according to a fifth embodiment will be described with reference to FIG. 9, below.

Figure 9:
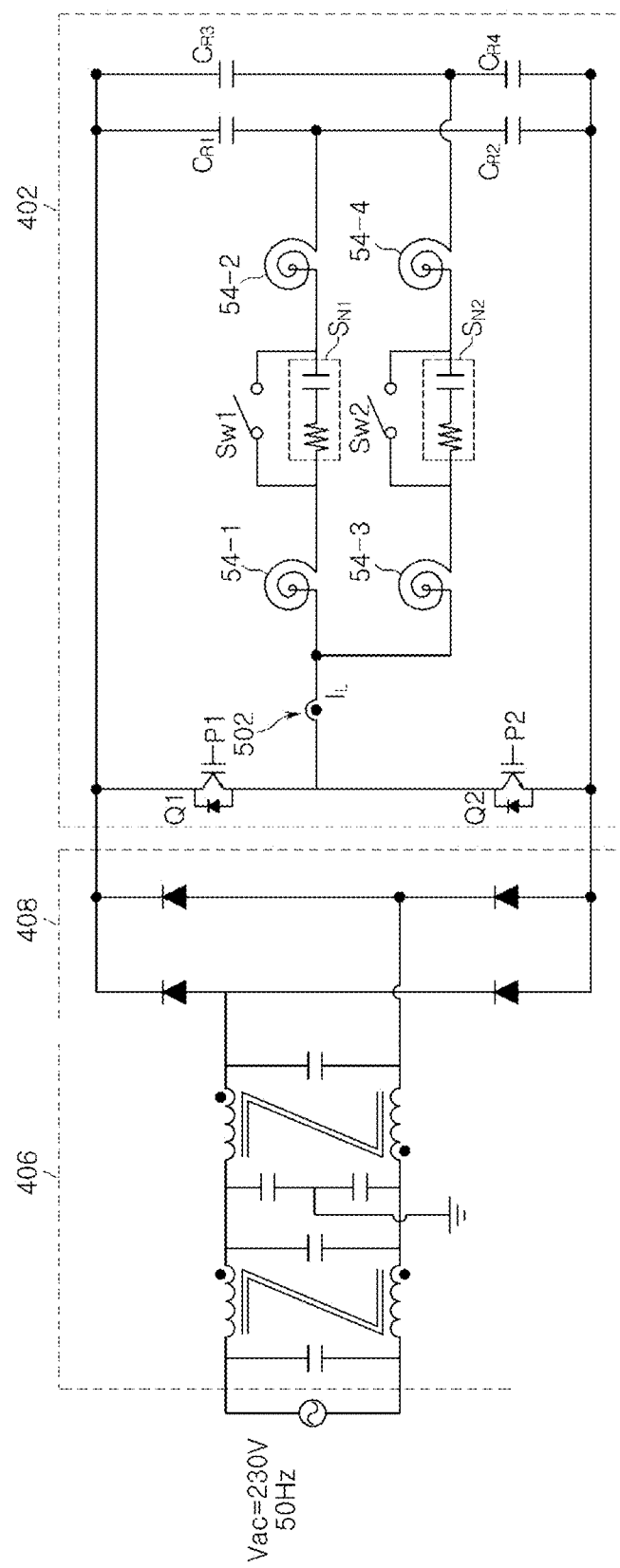
FIG. 9 shows a circuit configuration of an induction heating apparatus according to a fifth embodiment.

FIG. 9 shows a circuit configuration of an induction heating apparatus according to a fifth embodiment.

Referring to FIG. 9, in the coil driver 402 according to the fifth embodiment, a first surge suppressor SN1 may be connected in parallel to the first switching device Sw1 according to the first embodiment, and a second surge suppressor SN2 may be connected in parallel to the second switching device Sw2.

Each of the first surge suppressor SN1 and the second surge suppressor SN2 may include a resistor and a capacitor connected in series to remove surges or sparks that may be generated when the first or second switching device Sw1 or Sw2 is turned off, wherein the first surge suppressor SN1 functions to limit current flowing to the first and second coils 54-1 and 54-2 when the first switching device Sw1 is turned off, and the second surge suppressor SN2 functions to limit current flowing to the third and fourth coils 54-3 and 54-4 when the second switching device Sw2 is turned off.

Meanwhile, a circuit configuration including the surge suppressors SN1 and SN2 is not limited to that shown in FIG. 9. Hereinafter, in order to show another circuit configuration including the surge suppressors SN1 and SN2, a circuit configuration of the coil driver 402 according to a sixth embodiment will be described with reference to FIG. 10, below.

Figure 10:
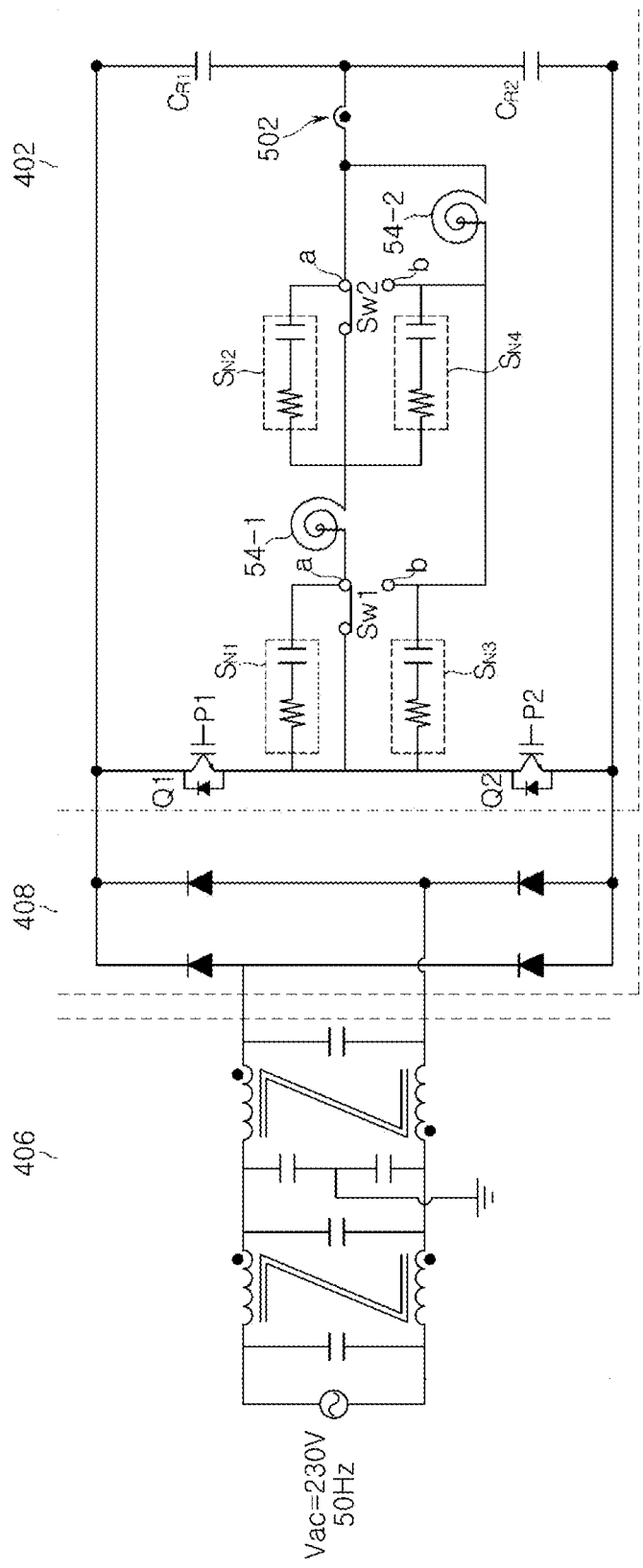
FIG. 10 shows a circuit configuration of an induction heating apparatus according to a sixth embodiment.

FIG. 10 shows a circuit configuration of an induction heating apparatus according to a sixth embodiment.

Referring to FIG. 10, in the coil driver 402 according to the sixth embodiment, a first surge suppressor SN1 and a second surge suppressor SN2 may be connected in series to both ends of the first coil 54-1, and a third surge suppressor SN3 and a fourth surge suppressor SN4 may be connected in series to both ends of the second coil 54-2.

Herein, one end of the first surge suppressor SN1 may be connected to a node of the two switching devices Q1 and Q2, and the other end of the first surge suppressor SN1 may be connected to the first coil 54-1.

Also, one end of the second surge suppressor SN2 may be connected to the first coil 54-1, and the other end of the second surge suppressor SN2 may be connected to the second coil 54-2.

Also, one end of the third surge suppressor SN3 may be connected to a node of the two switching devices Q1 and Q2, and the other end of the third surge suppressor SN3 may be connected to the second coil 54-2.

One end of the fourth surge suppressor SN4 may be connected to the first coil 54-1, and the other end of the fourth surge suppressor SN4 may be connected to the second coil 54-2.

Also, the first switching device Sw1 may be disposed at the node of the switching devices Q1 and Q2, and the first switching device Sw1 may be connected to a node a of the first surge suppressor SN1 and the first coil 54-1 or a node b of the third surge suppressor SN3 and the second coil 54-2, according to a control signal from the controller 412.

Also, the second switching device Sw2 may be disposed at a node between the first coil 54-1 and the second surge suppressor SN2, and the second switching device Sw2 may be connected to a node a between the second surge suppressor SN2 and the current sensor 502 or a node b between the fourth surge suppressor SN4 and the second coil 54-2, according to a control signal from the controller 412.

If the first switching device Sw1 is connected to the node a, and the second switching device Sw2 is connected to the node a, high-frequency current may flow to the first coil 54-1 so that the first coil 54-1 may operate.

Also, if the first switching device Sw1 is connected to the node a, and the second switching device Sw2 is connected to the node b, high-frequency current may flow to the first coil 54-1 and the second coil 54-2 so that the first and second coils 54-1 and 54-2 may operate.

Also, if the first switching device Sw1 is connected to the node b, and the second switching device Sw2 is connected to the node a, high-frequency current may flow to the second coil 54-2 so that the second coil 54-2 may operate.

Also, if the first switching device Sw1 is connected to the node b, and the second switching device Sw2 is connected to the node b, no high-frequency current may flow to the first and second coils 54-1 and 54-2 so that the first and second coils 54-1 and 54-2 may not operate.

In the coil driver 402 according to the sixth embodiment, the coils 54-1 and 54-2, the surge suppressors SN1 to SN4, and the switching devices Sw1 and Sw2 may be installed in series so that a coil to operate can be freely selected Meanwhile, the above-described embodiments relate to the coil driver 402 that is driven by the pair of switching devices Q1 and Q2, however, a plurality of coil drivers 402 may be provided, wherein the individual coil drivers 402 may be driven by different switching devices. Hereinafter, a plurality of coil drivers 402 to be driven by a plurality of switching devices will be described with reference to FIGS. 11 and 12.

Figure 11:
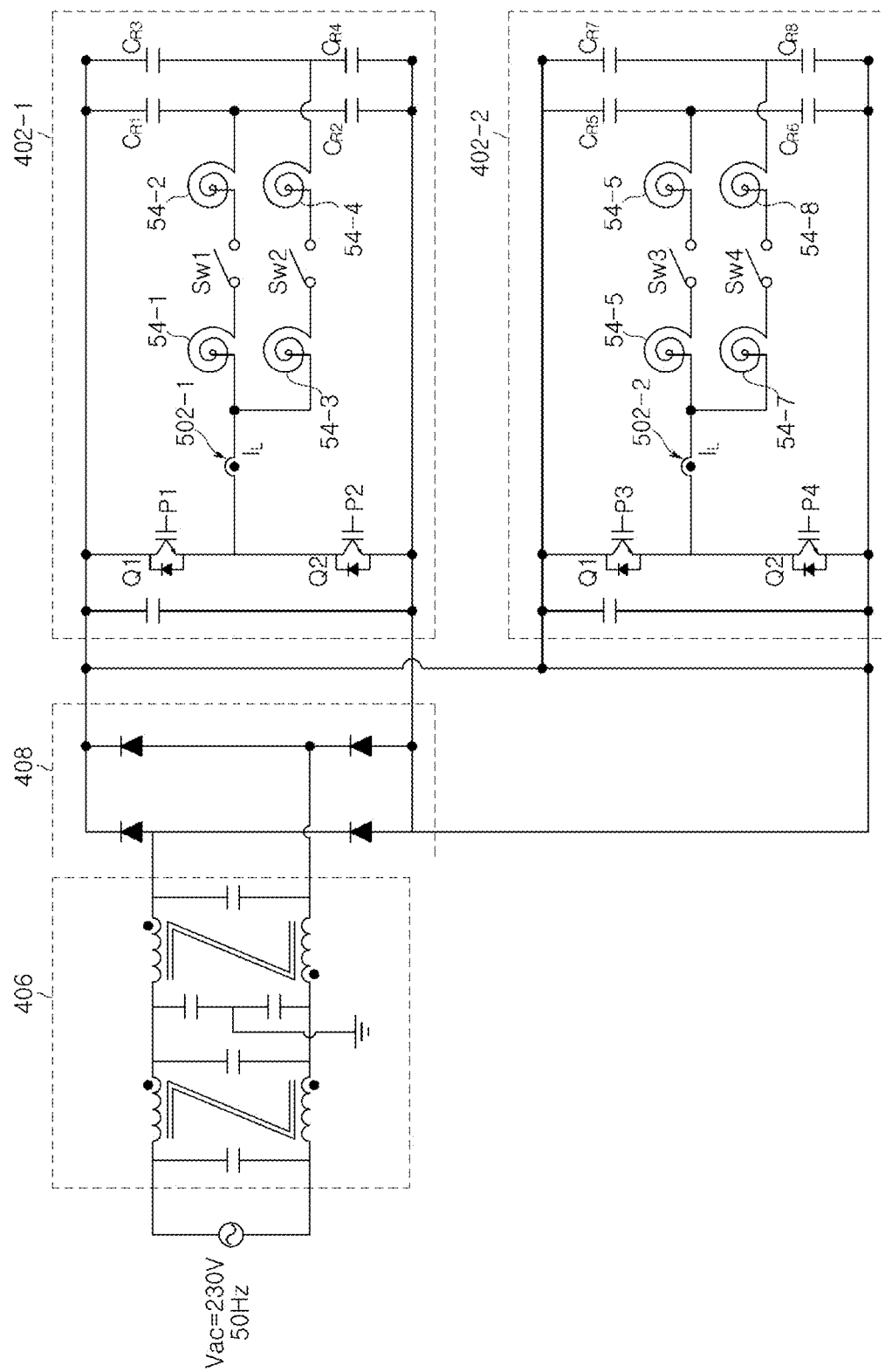
FIG. 11 shows a circuit configuration in which a plurality of coil drivers each being the coil driver according to the first embodiment are provided.
Figure 12:
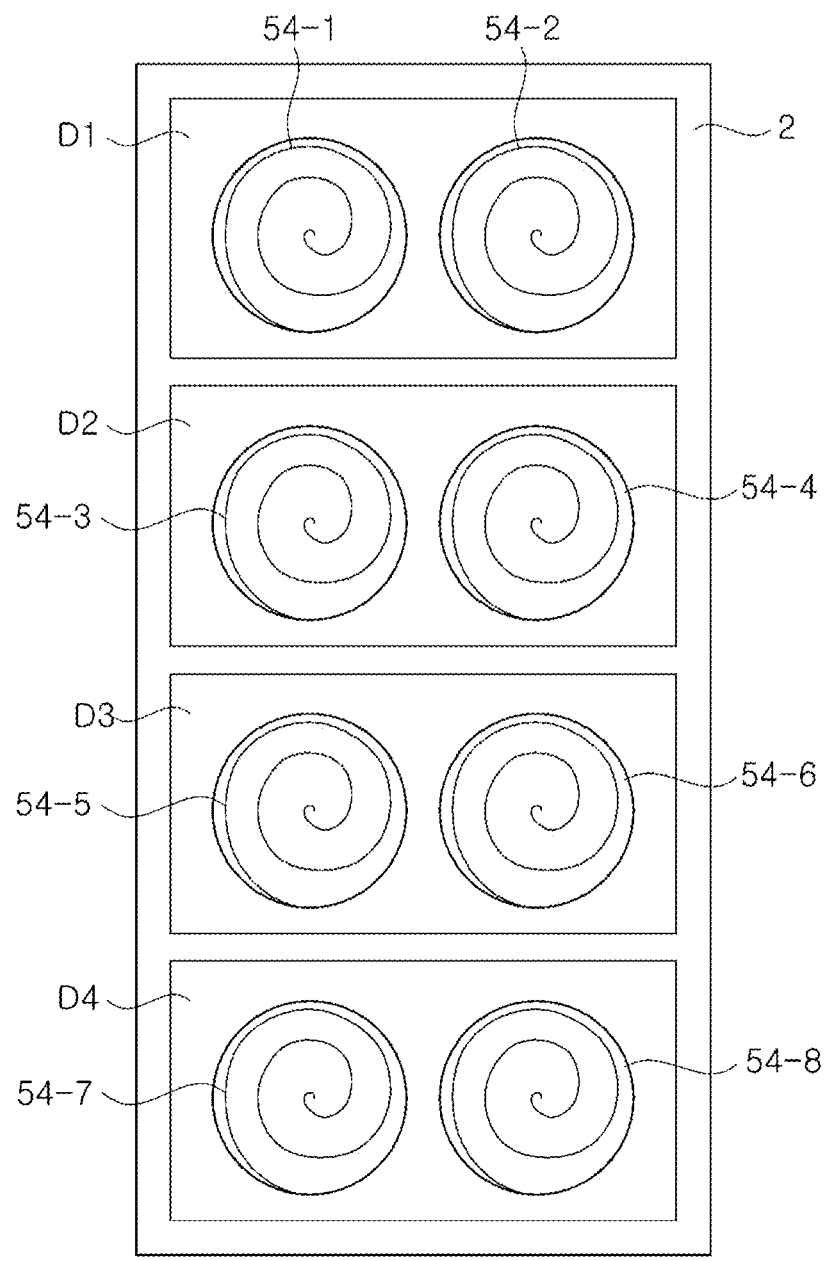
FIG. 12 shows an outer appearance of a cooking table in which a plurality of coil drivers are installed.

FIG. 11 shows a circuit configuration in which a plurality of coil drivers each being the coil driver according to the first embodiment are provided, and FIG. 12 shows an outer appearance of a cooking table in which a plurality of coil drivers are installed.

Referring to FIG. 11, a plurality of coil drivers 402 may be connected in parallel, and share an AC power source, a filter 406, and a rectifier 408.

Hereinafter, two coil drivers 402 connected in parallel will be referred to as a first coil driver 402-1 and a second coil driver 402-2. However, three or more coil drivers 402 may be connected to the rectifier 408.

Referring to FIG. 12, the induction heating apparatus may include 8 heating coils, and the heating coils may be arranged in pairs to form burners D1 to D4. Each of the burners D1 to D4 may operate as a high-output burner or a low-output burner according to a setting.

Each of the 8 coils 54-1 to 54-8 may have a coil driver 402 to generate and supply driving power. For example, according to the embodiment shown in FIG. 11, two coils 54-1 and 54-2 of the first burner D1 and two coils 54-3 and 54-4 of the second burner D2 may have a first coil driver 402-1, and two coils 54-5 and 54-6 of the third burner D3 and two coils 54-7 and 54-8 of the fourth burner D4 may have a second coil driver 402-2.

Hereinafter, a method of controlling the induction heating apparatus according to an embodiment will be described with reference to FIG. 13. FIG. 13 is a control flow chart of the induction heating apparatus according to an embodiment.

First, the induction heating apparatus may receive a user's command from an input device provided on a control panel, in operation S1110.

Herein, the user's command may be a command for selecting a burner or a coil. For example, the induction heating apparatus may receive a command for selecting a first burner including a first coil and a second coil from the input device.

Successively, a controller of the induction heating apparatus may select one or more coils corresponding to the user's selection command, in operation S1120. For example, if the coil driver according to the above-described first embodiment is provided, the controller may generate, when a user inputs a command for selecting the first burner including the first coil and the second coil, a control signal for the coil driver in order to turn on a switching device of the first coil and the second coil, and transfer the generated control signal to the switching device for driving the first coil and the second coil to turn on the switching device.

As a result, a LC resonant circuit may be formed due to the first and second coils and two capacitors connected to the first and second coils, a frequency of high-frequency current at which a magnitude of induced current becomes maximum may be decided according to the resonant frequency of the LC resonant circuit, and a frequency range of available high-frequency current may be also decided. Since a heating value of a cooking vessel is decided according to the frequency of high-frequency current, a heating range of the cooking vessel may change due to the LC resonant circuit of the first and second coils and the two capacitors connected to the first and second coils.

If a user inputs a command for selecting a second burner including a third coil and a fourth coil, the controller may generate a control signal for a coil driver in order to turn on a switching device of the third coil and the fourth coil, and transfer the generated control signal to the switching device for driving the third coil and the fourth coil to turn on the switching device. As a result, another LC resonant circuit may be formed due to the third and fourth coils and two capacitors connected to the third and fourth coils, and another frequency of high-frequency current at which a magnitude of induced current becomes maximum may be decided according to the resonant frequency of the other LC resonant circuit. As a result, due to the LC resonant circuit of the first and second coils and the two capacitors connected to the first and second coils, a heating range of the cooking vessel may change from that of the cooking vessel of when the first and second coils are selected.

Successively, a sensor of the induction heating apparatus may determine whether a cooking vessel is put above one or more selected coils, in operation S1130.

For example, if the first burner including the first coil and the second coil is selected, the controller may turn on the switching device connected to the first coil and the second coil, then detect current flowing to the first coil and the second coil when no cooking vessel is put above the first burner through the sensor, and store the detected current as a reference current value in advance in a storage device.

Then, the controller may detect current flowing to the first coil and the second coil, and compare the current to the reference current value. If the controller determines that the detected current is lower than the reference current value, the controller may determine that a cooking vessel is put above the first coil and the second coil which are the selected coils ("YES" in operation S1130). If the controller determines that the cooking vessel is put above the selected coils, the controller may drive the coil driver to supply high-frequency current to the selected coils, in operation S1140.

However, if the controller determines that the detected current is equal to or greater than the reference current value, the controller may determine that no cooking vessel is put above the first coil and the second coil which are the selected coils ("YES" in operation S1130). In this case, a display of a control panel may display that no cooking vessel is sensed, for a user, in operation S1150.

While the present disclosure has been particularly described with reference to exemplary embodiments, it should be understood by those of skilled in the art that various changes in form and details may be made without departing from the spirit and scope of the present disclosure.

The invention claimed is:

1. An induction heating apparatus comprising:
    a coil driver configured to have a plurality of selectable resonant frequencies; and
    a controller configured to control the coil driver,
    wherein the coil driver is further configured to drive a coil according to a control signal from the controller,
    wherein the coil comprises:
        a plurality of first coils connected in series, and
        a plurality of second coils connected in series,
    wherein the plurality of first coils are connected with the plurality of second coils in parallel,
    wherein the coil driver comprises:
        a first switching device disposed between the plurality of first coils,
        a second switching device disposed between the plurality of second coils,
        a plurality of first capacitors connected to the plurality of first coils,
        a plurality of second capacitors connected to the plurality of second coils,
        third and fourth switching devices forming a half-bridge circuit with the first capacitors and the second capacitors, and
        at least one current sensor configured to detect a magnitude of current flowing to either the plurality of first coils or the plurality of second coils based on a state of the first switching device and a state of the second switching device, and
    wherein the controller is configured to:
        provide first switch driving signals to the coil driver to drive the third and fourth switching devices to supply current having a predetermined frequency to the plurality of first coils and the plurality of second coils,
        provide second switch driving signals to the coil driver to turn on the first switching device and turn off the second switching device for a first resonant frequency,
        provide the second switch driving signals to the coil driver to turn off the first switching device and turn on the second switching device for a second resonant frequency, and
        provide the second switch driving signals to the coil driver to turn on the first switching device and turn on the second switching device for a third resonant frequency.

2. The induction heating apparatus of claim 1, wherein:
    the plurality of first capacitors connected to the plurality of first coils are two or more capacitors, and
    the plurality of second capacitors connected to the plurality of second coils are two or more capacitors.

3. The induction heating apparatus of claim 1, wherein the coil at least one current sensor is disposed between an input terminal of the coil driver and a node of the plurality of first coils connected in series and the plurality of second coils connected in series.

4. The induction heating apparatus of claim 3, wherein the controller is further configured to compare a current value detected by the at least one current sensor to a reference current value to determine whether a cooking vessel is put above the coil corresponding to the at least one current sensor.

5. The induction heating apparatus of claim 1, wherein the at least one current sensor comprises:
    a first current sensor connected between a first output terminal of the plurality of first coils connected in series and a first node of the plurality of first capacitors; and
    a second current sensor connected between a second output terminal of the plurality of second coils connected in series and a second node of the plurality of second capacitors.

6. The induction heating apparatus of claim 5, wherein the controller is further configured to compare a current value detected by one of the first current sensor or second current sensor to a reference current value to determine whether a cooking vessel is put above the plurality of coils corresponding to the respective current sensor.

7. The induction heating apparatus of claim 1, wherein:
    in the coil driver, the plurality of first capacitors connected to the plurality of first coils are two pairs of first capacitors,
    a fifth switching device is disposed between the two pairs of first capacitors, and
    in the coil driver, the plurality of second capacitors connected to the plurality of second coils are two pairs of second capacitors,
    the fifth switching device is disposed between the two pairs of second capacitors.

8. The induction heating apparatus of claim 7, wherein the controller is further configured to:
    turn on or off the first switching device disposed between the plurality of first coils,
    turn on or off the second switching device disposed between the plurality of second coils, and
    turn on or off the fifth switching device disposed between the two pairs of first capacitors.

* * * * *